(12) United States Patent
Belot

(10) Patent No.: US 6,366,166 B1
(45) Date of Patent: Apr. 2, 2002

(54) DOUBLE PASS BAND AMPLIFIER CIRCUIT AND A RADIO FREQUENCY RECEPTION HEAD

(75) Inventor: Didier Belot, Rives (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/654,505

(22) Filed: Aug. 30, 2000

(30) Foreign Application Priority Data

Aug. 31, 1999 (FR) .............................................. 99 11032

(51) Int. Cl.[7] .................................................. H03F 1/22
(52) U.S. Cl. ........................ 330/252; 330/302; 330/305; 330/311
(58) Field of Search ................................ 330/252, 302, 330/305, 311

(56) References Cited

U.S. PATENT DOCUMENTS

| | | | |
|---|---|---|---|
| 3,768,020 A | 10/1973 | Kurata | 325/347 |
| 5,521,554 A | 5/1996 | Okazaki | 330/306 |
| 6,023,192 A | * | 2/2000 | Didier | 330/311 |
| 6,236,274 B1 | * | 5/2001 | Liu | 330/302 |
| 6,242,986 B1 | * | 6/2001 | Adar | 330/302 |

FOREIGN PATENT DOCUMENTS

| | | |
|---|---|---|
| DE | 10 56 199 | 4/1959 |
| EP | 0 911 969 A1 | 4/1999 |

OTHER PUBLICATIONS

Bouisse, Gerard, "Dual Band RF Power Amplifiers," *Motorola Technical Developments*, 34:128–129, Mar. 1998.

* cited by examiner

Primary Examiner—Michael B Shingleton
(74) Attorney, Agent, or Firm—Lisa K. Jorgenson; E. Russell Tarleton; Seed IP Law Group PLLC

(57) ABSTRACT

An amplifier circuit including at least one first input amplifier; at least one second amplifier cascode-assembled with the first amplifier; and at least one reactive impedance circuit, mounted in series with the second amplifier, the reactive impedance circuit being formed by two impedances respectively exhibiting a maximum value for a first and a second frequency, to form a double-band amplifier circuit.

19 Claims, 3 Drawing Sheets

DOUBLE PASS BAND AMPLIFIER CIRCUIT AND A RADIO FREQUENCY RECEPTION HEAD

TECHNICAL FIELD

The present invention relates to the field of low noise amplifier circuits (LNA) and, more specifically, to amplifiers used in radio frequency reception heads. The present invention more specifically applies to low noise amplifiers and to radio frequency reception heads intended for mobile telephony circuits likely to operate in two distinct frequency bands, for example, centered on 950-MHz and 1.85-GHz frequencies. Such mobile telephony systems are called double-band systems and the central frequencies associated with each band depend on the telecommunication standards. For example, for standards GSM and DCS, the reception bands (that transit through a head to which the present invention applies) are respectively included between 925–960 MHz and 1805–1880 MHz, with the transmission bands being respectively included between 880–915 MHz and 1710–1785 MHz. The use of double-band systems is linked to a need for increasing the capacity of mobile telephony networks.

BACKGROUND OF THE INVENTION

FIG. 1 very schematically shows a conventional example of a double-band type radio frequency reception head 1. Head 1 receives a radio frequency signal RF that comes from a reception antenna (not shown) by transiting, possibly, through an antenna coupler and/or an isolation transformer (not shown). Most often, as will be seen hereafter, the radio frequency signal is of differential form. However, for simplification, FIG. 1 will be discussed in relation with a non-differential operation.

Signal RF is sent onto two low noise amplifiers 2, 3 (LNA1, LNA2), respectively associated with each central frequency of the system pass-bands. For example, amplifier 2 exhibits a maximum gain for a frequency on the order of 1850 MHz, while amplifier 3 exhibits a maximum gain for a frequency on the order of 950 MHz. Each amplifier 2, 3 is associated, at its output, with a filter 4, 5 (F1, F2) of band-pass type. Filters 4 and 5 are used to suppress the image frequencies of the respective central frequencies of the pass-bands. These filters are generally formed in so-called coplanar technology and are of surface wave type. In the above example, filter F1 is centered on the 950-MHz frequency, while filter F2 is centered on the 1850-MHz frequency. The respective outputs of filters 4 and 5 are sent onto first inputs of two multipliers 6, 7. The second respective inputs of multipliers 6 and 7 receive a frequency from a local oscillator OL1, OL2. The respective frequencies of local oscillators OL1 and OL2 are chosen so that, at the output of one of multipliers 6 and 7, the central frequency of signal FI corresponds, whatever the channel, to the intermediary frequency chosen for the radio frequency head. According to applications, the frequency of output signal FI of head 1 is the central frequency of the channel, or another arbitrary low frequency (for example, on the order of some hundred MHz, or even less). In applications to mobile telephony, the width of each channel is 200 kHz.

Amplifiers 2 and 3 and multipliers 6 and 7 are controlled by signals, respectively CTRL and NCTRL, having the function of selecting one of the two parallel paths of the radio frequency head according to the band in which the received channel is located.

FIG. 2 still very schematically shows a second example of a radio frequency reception head 1'. As in the example of FIG. 1, each frequency band is associated with a low noise amplifier, respectively 2, 3, the activation of which is obtained by a control signal, respectively CTRL and NCTRL. The essential difference between FIG. 1 and 2 is that, in FIG. 2, an image frequency reject mixer 10 is used. Such a mixer includes two input multipliers 11, 12 receiving, each, the signal coming from the operating amplifier 2 or 3 and the frequency provided by a local oscillator OL1 or OL2, respectively phase-shifted by 90° for multiplier 11 and unshifted for multiplier 12. The selection of the local oscillator OL1 or OL2 to be used is effected by means of a switch Ko controlled, for example, by one of signals CTRL or NCTRL to select the local oscillator adapted to the amplifier 2 or 3 that is used. The respective outputs of multipliers 11 or 12 are individually sent, via selectors, respectively K1 and K2, onto phase-shifters by plus or minus 45°. Thus, multiplier 11 is associated with two phase-shifters 13 and 14, respectively by +45° and by −45°, the respective inputs of which correspond to two output terminals of selector K1, the input of which is connected to the output of multiplier 11. Similarly, multiplier 12 is associated with two phase-shifters 15 and 16 respectively by +45° and by −45°, the respective inputs of which are associated with two output terminals of selector K2, the input terminal of which is connected to the output of multiplier 12. The output terminals of phase-shifters 13 and 14 are connected to a first input of an adder 17 while the output terminals of phase-shifters 15 and 16 are connected to a second input of this adder 17, the output of adder 17 providing the signal at intermediary frequency FI. Of course, a single phase-shifter of each pair 13, 14 or 15, 16 is used according to the received radio frequency band. Further, the phase-shifters are used in opposition, that is, if the output of multiplier 11 is phase-shifted by +45°, the output of multiplier 12 is phase-shifted by −45°, and conversely. Selectors K1 and K2 are, for example, respectively controlled by signals CTRL and NCTRL to select the respective phase shifts to be brought according to the frequency of signal RF.

The operation of the double-band radio frequency heads such as illustrated in FIGS. 1 and 2 is perfectly well known and will not be detailed any further. It should only be noted that image frequency reject mixer systems are described in many publications, for example "A 2.5 GHz BiCMOS image reject front end", by M. D. Mc Donald, ISSCC93, paper TP94, pp. 144–145, "An improved Image Reject Mixer and a Vco fully integrated in a BiCMOS process", by D. Pache, J. M. Fournier, G. Billot and P. Senn, in Proceed in Nomadic Microwave for Mobile Communications and Detection, Arcachon, November 1995, and "An improved 3 V 2 GHz BiCMOS Image Reject Mixer IC" by D. Pache, J. M. Fournier, G. Billot and P. Senn, in Proceedings of CICC, May 1995, USA, the respective contents of which are incorporated herein by reference.

FIG. 3 very schematically shows the upstream portion of a radio frequency reception head 1, 1' such as illustrated in FIGS. 1 and 2, that is, the portion located upstream of amplifiers 2, 3. In the example of FIG. 3, the case where the low noise amplifiers receive differential signals has been shown, which is most often the case. As illustrated in FIG. 3, an antenna 20 intercepts the radio frequency signal. This antenna is associated with the primary winding 21 of a transformer 22, the secondary winding of which has a midpoint, so that a first portion 23a provides signal RF while a second portion 23b provides inverted signal NRF. The midpoint of the secondary winding receives a voltage reference REF, for example the ground. Signals RF and NRF are each sent onto the two differential inputs of low noise amplifiers 2 and 3. Each amplifier 2, 3, has, similarly, two differential outputs towards filters 4 and 5 (FIG. 1) or mixer 10 (FIG. 2).

A disadvantage of conventional double-band radio frequency reception heads is that low noise amplifiers are particularly bulky. Accordingly, the use of two low noise amplifiers for each frequency of the double-band system adversely affects the system miniaturization, be it in terms of silicon surface for the integration of the radio frequency head, or in terms of number of input/output terminals, each frequency having its specific input. This in particular introduces two external matching networks. As illustrated in FIG. 4 hereafter, the input signals of low noise amplifiers are generally submitted to an impedance matching by means of external inductive and capacitive elements. The use of two low noise amplifiers proportionally increases the copper surface required to form the external inductive components.

FIG. 4 shows an example of a low noise amplifier circuit having a differential structure. Such an amplifier is based on the use of two input amplifiers, for example, bipolar transistors T1 and T2, each associated in series with two other amplifiers, for example bipolar transistors T3 and T4, to form two cascode assemblies. Each cascode assembly forming one of the branches of the differential circuit is associated with a trap circuit (circuit LC), respectively 30 and 31, assembled in series with one of amplifiers T3 and T4. Further, each amplifier T1, T2 is associated with a compensation inductance, respectively 32, 33, the function of which will be explained hereafter. LC circuits 30 and 31 are respectively formed of an inductance 34 in parallel with a capacitor 35 and of an inductance 36 in parallel with a capacitor 37. Inductances 36 and 34 have the same values, as well as capacitors 35 and 37.

A first terminal of inductances 34, 36 and of capacitors 35, 37 is connected to a terminal 38 of application of a supply voltage $V_{cc}$. The second respective terminals of inductances 34 and 36 and of capacitors 35 and 37 are, in the example of FIG. 4, connected to the collector of transistor T3 or T4 according to the LC circuit 30 or 31 to which they belong. The bases of transistors T3 and T4 are grounded while their emitters are connected to the respective collectors of transistors T1 and T2. The respective emitters of transistors T1 and T2 are connected to a first terminal of the compensation inductances 32 and 33 to which they are associated. The second respective terminals of inductances 32 and 33 are connected to a first terminal of a current source 39, the other terminal of which is grounded. The respective bases of transistors T1 and T2 receive input signals IN and NIN via matching inductances 40 and 41, the function of which will be discussed hereafter. Differential outputs OUT and NOUT of the low noise amplifier of FIG. 3 are defined by the respective collectors of transistors T3 and T4.

To obtain a low noise amplifier, that is, an amplifier having a strong rejection rate out of the desired pass-band and a strong gain for the central frequency of this pass-band, inductances 32, 33, 34, 36, 40 and 41, as well as capacitors 35 and 37, are matched accordingly.

Base inductances 40 and 41 and emitter inductances 32 and 33 of respective transistors T1 and T2 enable matching the input impedance of the amplifier. Inductances 32 and 33 enable matching with the capacitance of each input of the differential circuit, essentially formed by the base-emitter capacitance of each transistor T1 and T2. Inductances 40 and 41 enable matching with the base capacitance of transistors T1 and T2. Inductances 40 and 41 actually symbolize the inductances linked with the path of the input signals as well as with the inductances of the connection pads and of the package containing the integrated circuit. It should be noted that the more the input impedance of transistors T1 and T2 is inductive, the narrower the band.

The use of a differential structure enables obtaining a common mode rejection, while the cascode assemblies make the input impedance independent from the reactive loads formed by LC circuits 30 and 31. To obtain a low noise amplifier, the respective LC circuits must be resonant at the chosen value, that is, at the central frequency of the selected useful band. Therefore, each band of the reception head is associated with an LNA dedicated thereto.

An amplifier circuit such as illustrated in FIG. 4 is described, for example, in European patent application EP-A-0911969 of the applicant, the content of which is incorporated herein by reference.

In addition to problems linked with the space occupied by two low noise amplifiers, the needs for additional switches to select that of the amplifiers that is to operate can generate turn-on delays in the system due to switching delays. Further, the use of switches takes up additional space and requires control signals.

SUMMARY OF THE INVENTION

The embodiments of the present invention provide a novel radio frequency signal reception head only using a single low noise amplifier and being likely to be assigned to a double-band system.

Another embodiment of the present invention provides a low noise amplifier with two distinct pass-bands.

The embodiments of the present invention provide a solution that minimizes the use of switches to minimize the space taken up by the circuit in integrated form.

The embodiments of the present invention also provide a solution that is particularly well adapted to mobile telephony systems.

To achieve the foregoing, the embodiments of the present invention provide an amplifier circuit including at least one first input amplifier, at least one second amplifier cascode-assembled with the at least one first amplifier, at least one reactive impedance circuit, mounted in series with the at least one second amplifier, the at least one reactive impedance circuit being formed by two impedances respectively exhibiting a maximum value for a first and a second frequency, to form a double-band amplifier circuit.

According to an embodiment of the present invention, said impedances are associated in series and are sized to each exhibit a maximum value and a high quality factor on one of the two operating frequencies of the circuit.

According to an embodiment of the present invention, each impedance is formed by an inductance in parallel with a capacitor.

According to an embodiment of the present invention, the respective ratios between the inductance and the capacitor of each impedance range between 3,000 and 4,500.

According to an embodiment of the present invention, the inductances and capacitors of the impedances are sized so that the square root of the ratio between the inductance and the capacitance of the first impedance is greater than $10^{10}$ times the value of the inductance of the second impedance, and that the square root of the ratio between the impedance and the capacitance of the second impedance is greater than $0.5*10^{10}$ times the value of the inductance of the first impedance.

According to an embodiment of the present invention, the circuit includes two identical branches in parallel, each formed of a cascode assembly of a first and of a second amplifier, in series with a reactive impedance circuit.

According to an embodiment of the present invention, the respective impedances of the differential inputs of the amplifier circuit are sized to obtain a wide band matching covering the two operating frequency bands of the amplifier.

The present invention also provides a radio frequency signal reception head adapted to operating on two bands of different frequencies, including an amplifier circuit such as hereabove.

The foregoing features and advantages of the present invention will be discussed in detail in the following non-limiting description of specific embodiments in connection with the accompanying drawings.

DETAILED DESCRIPTION OF THE INVENTION

Figure 3:
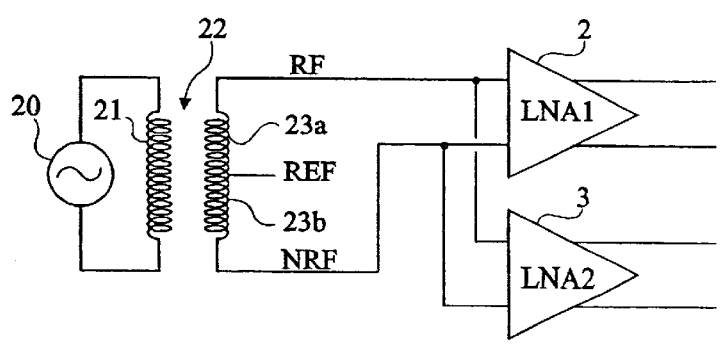
FIG. 3 illustrates the upstream portion of a radio frequency reception head.

The same elements have been designated with the same references in the different drawings. For clarity, only those elements that are necessary to the understanding of the present invention have been shown in the drawings and will be described hereafter. In particular, the actual reception portion (antenna, transformer), which has been very schematically shown in FIG. 3, will not be detailed any further and is no object of the present invention. Similarly, the exploitation of intermediary frequency signals is no object of the present invention and will not be detailed.

The disclosed embodiments of the present invention take advantage of the cascode structure of an amplifier to form a low noise amplifier by fully using the independence of the input impedance with respect to the impedances of the trap circuits (LC) forming the reactive impedances.

Thus, according to the present invention, the input impedances of the input amplifiers of the circuit are sized to obtain a wide input pass-band that covers the two useful bands desired for the system.

Another feature of the embodiments of the present invention is to provide reactive loads having two distinct resonance frequencies.

For this purpose, a first proposed solution provides two LC circuits for each branch of the differential amplifier circuit and a selector of the LC circuit according to the frequency band of the received signal. This solution, however, is not a preferred solution because it requires using switches, the on-state resistances of which risk altering the quality factor of the amplifier. Altering this quality factor widens the pass-band, increases the noise and decreases the amplifier gain.

Figure 5:
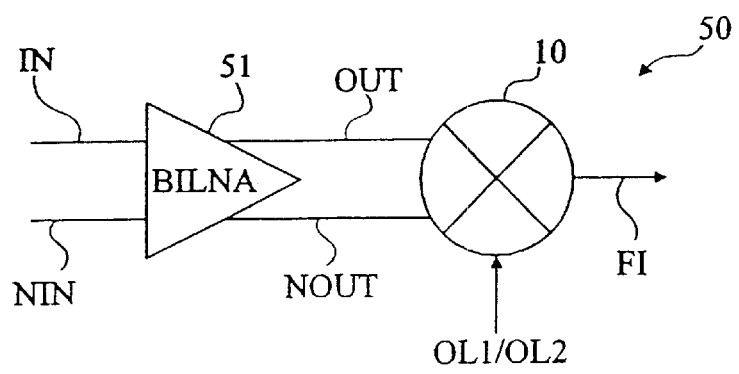
FIG. 5 very schematically shows an embodiment of a radio frequency reception head according to the present invention.

FIG. 5 very schematically shows an embodiment of a radio frequency reception head 50 according to one embodiment of the present invention. This radio frequency reception head is essentially formed of a double-band low noise amplifier 51 (BILNA). Preferably, circuit 51 has a differential structure and receives the input radio frequency signals IN and NIN corresponding, for example, to signals RF and NRF of FIG. 3. Differential outputs OUT and NOUT of amplifier 51 are sent onto differential inputs of a conventional image frequency reject mixer 10 receiving, in addition to control signals not shown, frequencies from local oscillators OL1 and OL2. Conventionally, the output of mixer 10 provides signal FI at the intermediate frequency desired for the system.

A feature of the present invention is to use, as a reactive load of the cascode assemblies of a low noise amplifier, reactive impedances that do not have the same value over the entire frequency band. According to a preferred embodiment of the present invention, these reactive impedances are provided in the form of two impedances associated in series. A first one of the impedances has a maximum value for a first one of the two frequencies of the double-band system, and a value which is the smallest possible for the other one of the frequencies. The other impedances has, conversely, a maximum value for the second frequency and the smallest possible value for the first frequency. By means of such reactive impedances, the obtained amplifier circuit has a gain with two maximum values, respectively, at the two central frequencies of the double-band system.

Figure 6:
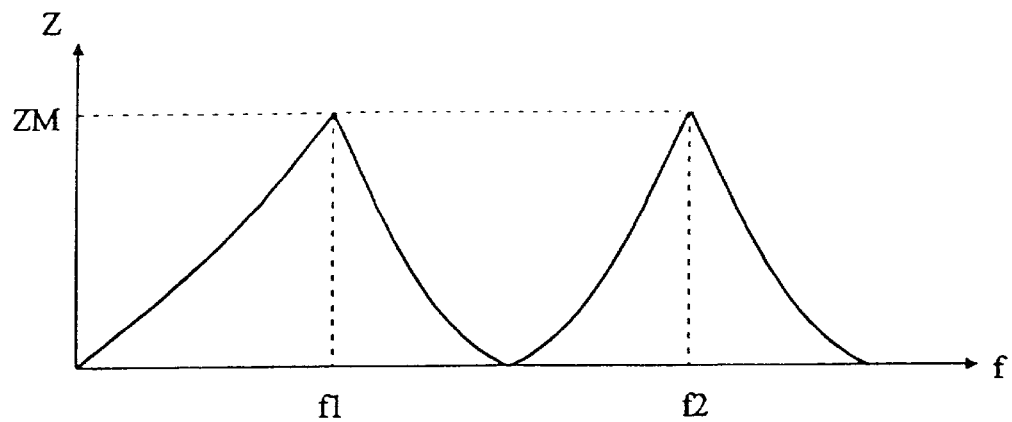
FIG. 6 illustrates the impedance-frequency characteristic of a reactive load of a low noise amplifier according to the present invention.

FIG. 6 shows the impedances-frequency characteristic of a reactive impedance of a low noise amplifier circuit according to the present invention. As illustrated in FIG. 6, the impedance exhibits a maximum value ZM for both system operating frequencies f1 and f2. The first peak at frequency f1 is essentially due to the first impedance used while the second peak is essentially due to the second impedance used. As previously indicated, the contribution of each impedance is minimum when the other impedance brings a maximum contribution. Accordingly, impedance Z strongly decreases as soon as the frequency diverges from frequencies f1 and f2.

It should be noted that although the two maximum impedance levels have been shown as being identical in FIG. 6, this is only by way of example and the levels may differ from each other.

It should also be noted that, for an amplifier circuit with a differential structure, each branch of the structure includes a double reactive impedance according to the present invention.

The present invention takes advantage of the fact that frequencies f1 and f2 desired for the double-band system are sufficiently distant from each other to enable the first series reactive impedance to be negligible with respect to the second impedance and vice-versa according to the system frequency.

Figure 4:
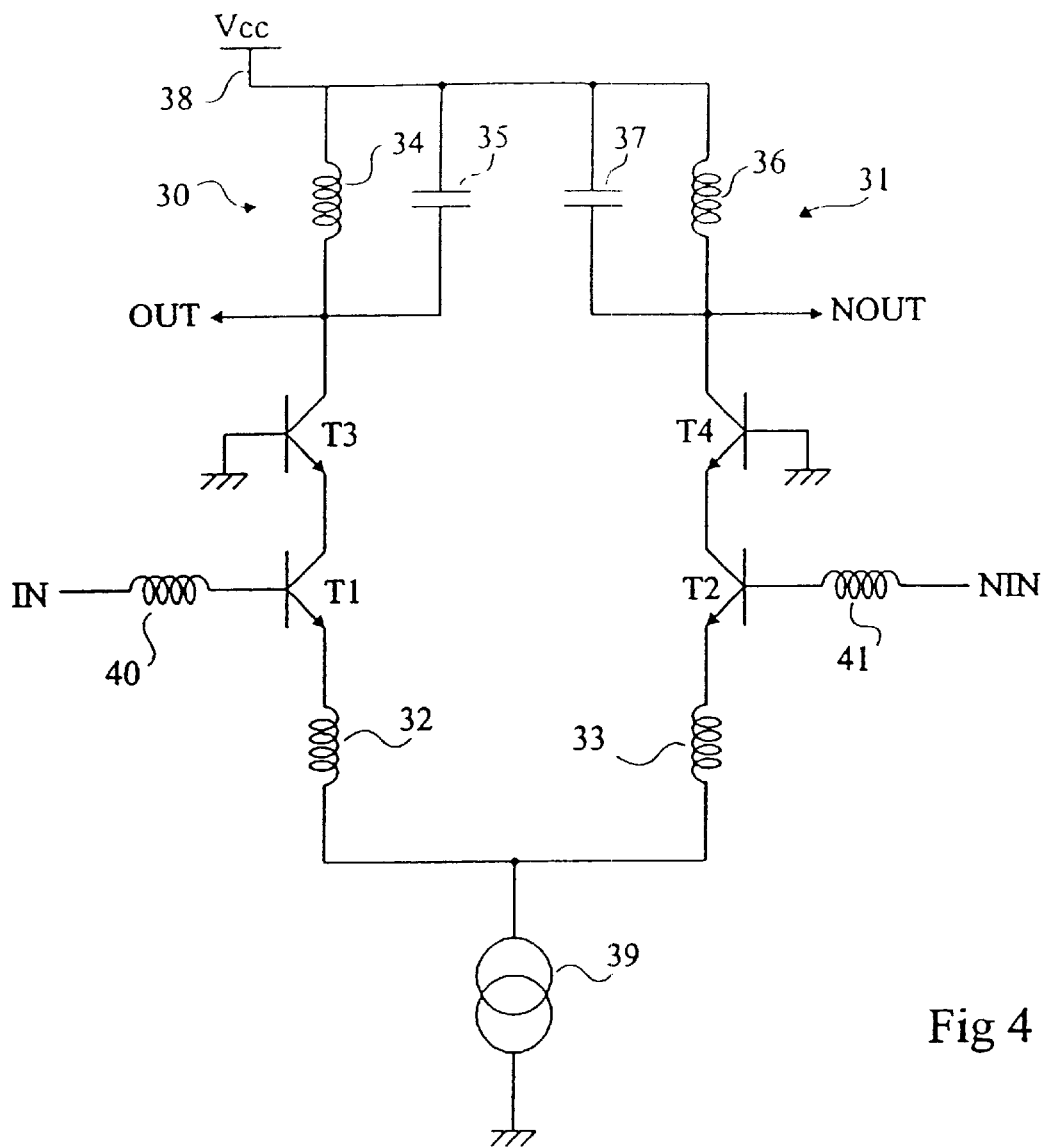
FIG. 4 illustrates a low noise amplifier circuit.
Figure 7:
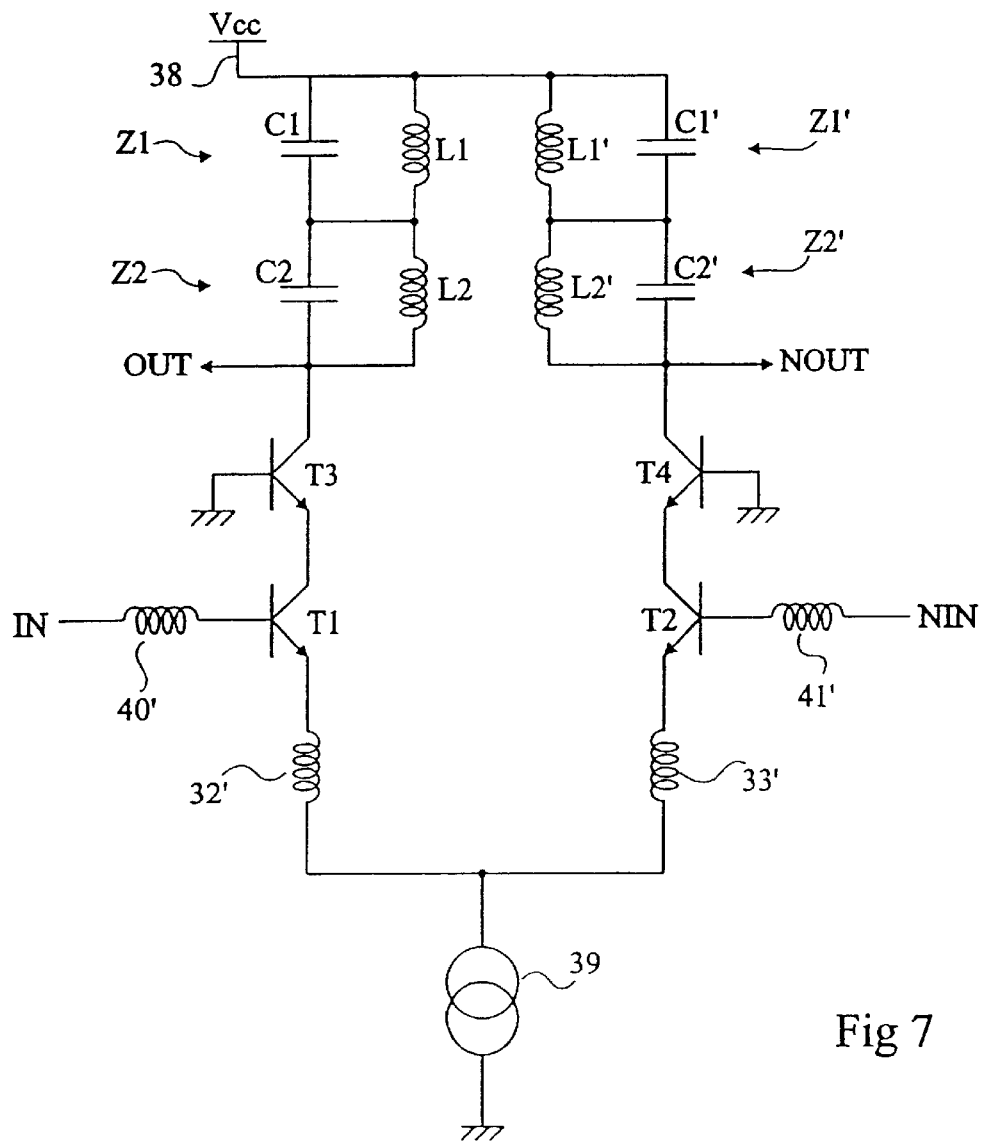
FIG. 7 shows an embodiment of a low noise differential amplifier according to the present invention.

FIG. 7 shows an embodiment of a differential amplifier according to the present invention. This drawing resumes the elements of a conventional amplifier such as illustrated in FIG. 4, and differs therefrom essentially by the arranging of two impedances Z1, Z2 and Z1', Z2' instead of LC circuits 30 and 31 of FIG. 4.

On the side of the first branch (transistors T1, T3), impedance Z1 is formed of a capacitor C1 in parallel with an inductance L1, and impedance Z2 is formed of a capacitor C2 in parallel with an inductance L2. On the second branch side (transistors T2, T4), impedance Z1' is formed of a capacitor C1' in parallel with an inductance L1', and impedance Z2' is formed of a capacitor C2' in parallel with an inductance L2'.

It should be noted that, according to the present invention, respective input inductances 40' and 41' and respective emitter inductances 32' and 33' are sized to exhibit a small quality factor, to obtain an input impedance matching covering the two frequency bands of the system.

It should also be noted that the values of the capacitors and inductances of the reactive impedances of the two branches are symmetrical. Accordingly, C1=C1', L1=L1', C2=C2', and L2=L2'.

Another feature of the present invention is that the respective values of the capacitors and inductances of the reactive impedances are adapted to the maximum values desired for the impedance of the amplifier circuit, to obtain a strong gain at frequencies f1 and f2. This is compatible with the desire to have two narrow bands to obtain a low noise factor on the amplified band.

Another feature of the respective values of the capacitors and inductances of the reactive loads is linked to the values of frequencies f1 and f2. Indeed, the capacitors and inductances must be sized so that $2\pi f1=1/\sqrt{L1C1}$ and $2\pi f2=1/\sqrt{L2C2}$.

According to the present invention, the inductances and capacitors are, preferably, sized so that ratios L1/C1 and L2/C2 both range between 3,000 and 4,500.

Based on these respective ratios between the inductances and capacitances, a range of possible values for sizing components L1, C1 and L2, C2, according to the desired frequencies f1 and f2 is obtained. The selection from this range of values is, according to the present invention, performed, on the one hand, so that each impedance is minimum when the other impedance is maximum, and to be compatible with an integration of the amplifier circuit in the form of an integrated circuit.

To respect the constraint of distinct narrow bands, the components are, preferably, sized to fulfil the following relations: $\sqrt{L1C1}>10^{10}L2$, and $\sqrt{L2C2}>0.5*10^{10}L1$.

As a specific example of an embodiment, adapted to a radio frequency reception head for a double-band mobile phone of 950-MHz and 1.85-GHz frequencies, the following values may be used to form the amplifier circuit of FIG. 7:

L1=9 nH

C1=2.5 pF

L2=4.5 nH

C2=1.125 pF.

With such values, gains of more than 20 dB are obtained for frequencies f1 and f2, and the respective modules of the maximum impedances at frequencies f1 and f2 are 250 and 273 ohms for respective impedances Z1 and Z2.

It should be noted that what has been discussed hereabove for impedances Z1 and Z2 also applies to impedances Z1' and Z2'.

Figure 1:
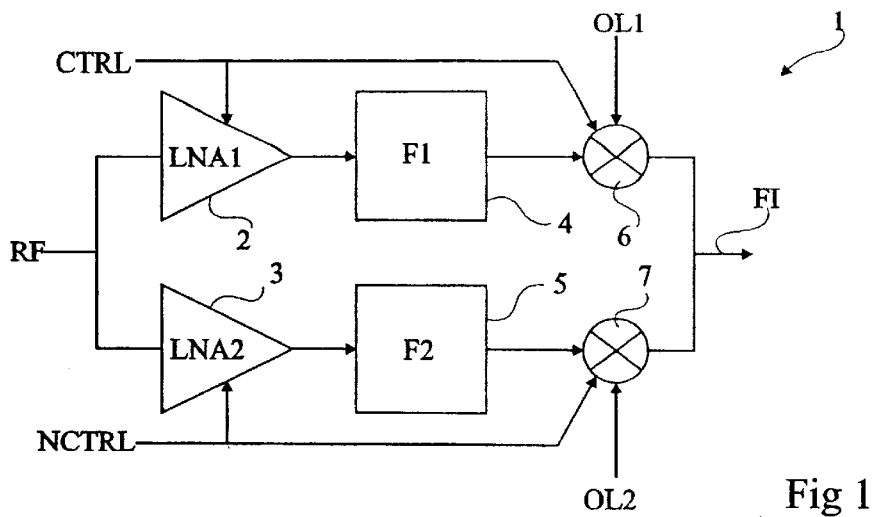
FIG. 1 illustrates a double-band radio frequency reception head.
Figure 2:
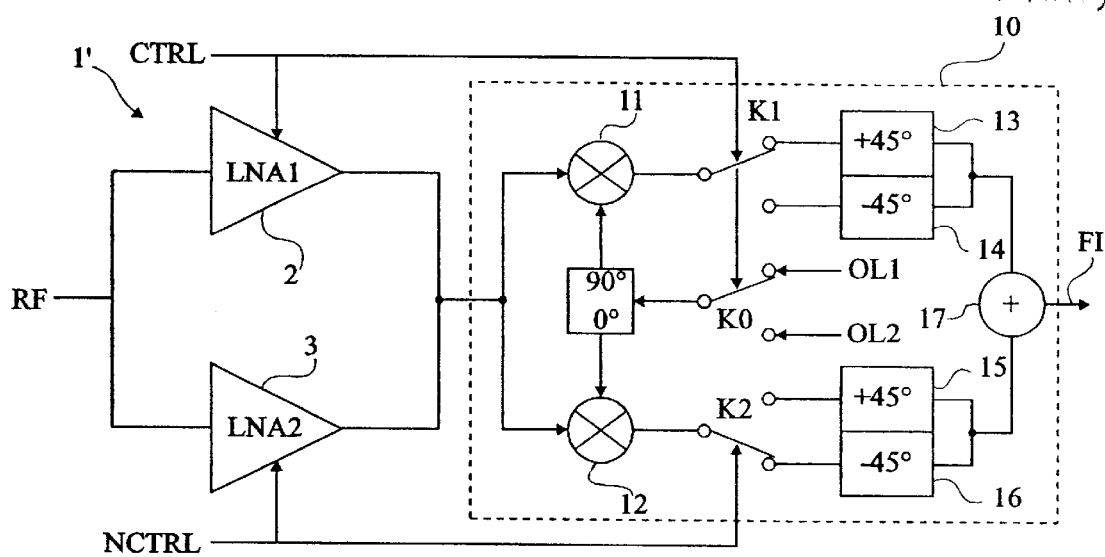
FIG. 2 illustrates another double-band radio frequency reception head.

To associate a low noise double-band amplifier according to the present invention with a radio frequency reception head, any conventional image reject system may be used downstream, preferably an image frequency reject mixer such as illustrated in FIG. 2.

An advantage of the present invention is that it enables reducing the number of input/output terminals of the reception head since it uses a single amplifier.

Another advantage of the present invention is that it suppresses all the delays of switching from one band to the other since the amplifier circuit of the present invention operates permanently for both bands.

Another advantage of the present invention is that it is no longer necessary to use control signals to activate one amplifier circuit or the other. This provides a surface and consumption gain.

As applied to mobile telephony, the present invention has the advantage of actively contributing to the bulk reduction and to the increase of the autonomy of portable phones.

Of course, the present invention is likely to have various alterations, modifications, and improvements which will readily occur to those skilled in the art. In particular, the sizing of the different components of the low noise double-band amplifier circuit of the present invention is within the abilities of those skilled in the art based on the relations and functional indications given hereabove. Further, it should be noted that a double-band amplifier circuit according to the present invention can be made with bipolar transistors or MOS transistors. Moreover, the implementation of the present invention is compatible with the conventional implementation of other functions of a low noise amplifier circuit. For example, the present invention may be combined with a double-gain amplifier function such as described in above-mentioned European patent application EP-A-0911969.

Finally, it should be noted that although the present invention has been described hereabove in relation with a differential amplifier that forms a preferred embodiment, the principle of the present invention (reactive impedances in series) may also be implemented in a low noise amplifier having a non-differential structure. The integrating, in a radio frequency reception head of a mobile phone, of an amplifier circuit according to the present invention, whether or not it has a differential structure, is performed substantially identically to the integrating of a conventional amplifier.

Although the present invention has been described hereabove in relation with a double-band system, it should be noted that it may easily be transposed to other multiple-band systems, for example triple-band systems, provided that the ratios between neighboring central frequencies are substantially identical (for example, for frequencies f1 of 950 MHz and f2 of 1.85 GHz, the third central frequency f3 must be approximately 450 MHz or 3.8 GHz). For such an application, it will be ascertained that the impedance rules previously defined for frequencies f1 and f2 are respected for f2 and f3 if f3>f2, or f3 and f1 if f3<f1.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An amplifier circuit including:
   at least one first input amplifier;
   at least one second amplifier cascode connected with the at least one first amplifier; and
   at least one reactive impedance circuit coupled in series with the at least one second amplifier, including two impedances respectively exhibiting a maximum value for a first and a second frequency, to form a double-band amplifier circuit.

2. The amplifier circuit of claim 1, wherein said impedances are associated in series and are sized to each exhibit a maximum value and a high quality factor on one of the two operating frequencies of the circuit.

3. The amplifier circuit of claim 1, wherein each impedance is formed by an inductance in parallel with a capacitor.

4. The amplifier circuit of claim 3, wherein the respective ratios between the inductance and the capacitor of each impedance range between 3,000 and 4,500.

5. The amplifier circuit of claim 3, wherein the inductances and capacitors of the impedances are sized so that the square root of the ratio between the inductance and the capacitance of the first impedance is greater than $10^{10}$ times the value of the inductance of the second impedance, and that the square root of the ratio between the impedance and the capacitance of the second impedance is greater than $0.5*10^{10}$ times the value of the inductance of the first impedance.

6. The amplifier circuit of claim 1, comprising two identical branches in parallel, each formed of a cascode assembly of a first and of a second amplifier, in series with a reactive impedance circuit.

7. The amplifier circuit of claim 6, comprising differential inputs the respective impedances of which are sized to obtain a wide band matching covering the two operating frequency bands of the amplifier.

8. A receiver circuit, comprising:
   a radio frequency signal reception head configured to operate on two bands of different frequencies, the reception head comprising:
   at least one first amplifier having an input terminal;
   at least one second amplifier connected in cascode with the at least one first amplifier; and
   at least one reactive impedance circuit coupled in series with the second amplifier, the at least one reactive impedance circuit including a first impedance exhibiting a maximum value for a first frequency and a second impedance exhibiting a maximum value for a second frequency, the first and second impedances forming a double-band amplifier.

9. The circuit of claim 8, wherein each of the first and second impedances is formed by an inductance coupled in parallel with a capacitor.

10. The circuit of claim 9, further comprising a ratio between the inductance and the capacitor of each impedance, the ratio configured to be in the range of 3,000 to 4,500.

11. The circuit of claim 9, further comprising a ratio between the inductance and the capacitor of each impedance, and wherein the inductances and capacitors of the impedances are sized to have the square root of the ratio between the inductance and the capacitance of the first impedance greater than $10^{10}$ times the value of the inductance of the second impedance, and the square root of the ratio between the impedance and the capacitance of the second impedance is greater than $0.5*10^{10}$ times the value of the inductance of the first impedance.

12. The circuit of claim 8, comprising two identical branches in parallel, each formed of a cascode assembly of the first amplifier and the second amplifier in series with the reactive impedance circuit.

13. The circuit of claim 12, wherein the input terminal of the first amplifier of each branch together comprise differential inputs.

14. The circuit of claim 13, wherein the impedances are sized to obtain a frequency band covering the first and second frequencies of the first and second amplifiers.

15. An amplifier circuit, comprising:
   first and second parallel branches, each branch comprising:
   a first transistor having a control terminal coupled to a reference terminal, a first terminal coupled to a supply voltage, and a second terminal;
   a second transistor having a control terminal coupled to an input, a first terminal coupled to the second terminal of the first transistor, and a second terminal coupled to a current source; and
   a reactive impedance circuit coupled in series between the supply voltage and the first terminal of the first transistor, the reactive impedance circuit comprising series coupled first and second capacitors connected in parallel with series coupled first and second inductances.

16. The circuit of claim 15, comprising a node between the reactive impedance circuit and the first transistor of each parallel branch, each node forming an output, and the control terminals of the second transistors comprise differential inputs.

17. The circuit of claim 16, further comprising an inductance coupled between the current source and the second terminal of the second transistor in each parallel branch.

18. The circuit of claim 17, wherein the current source comprises a single current source coupled to the first and second parallel branches.

19. The circuit of claim 18, further comprising a connection formed between the first and second capacitors and the first and, second inductors in each of the first and second parallel branches.

* * * * *

UNITED STATES PATENT AND TRADEMARK OFFICE
CERTIFICATE OF CORRECTION

PATENT NO. : 6,366,166 B1
DATED : April 2, 2002
INVENTOR(S) : Belot

It is certified that error appears in the above-identified patent and that said Letters Patent is hereby corrected as shown below:

<u>Title page,</u>
Item [*] Notice, delete the phrase "by 0 days" and insert -- by 6 days --

Signed and Sealed this

Eleventh Day of May, 2004

JON W. DUDAS
*Acting Director of the United States Patent and Trademark Office*